United States Patent [19]

Yokoyama

[11] Patent Number: 4,903,090
[45] Date of Patent: Feb. 20, 1990

[54] SEMICONDUCTOR DEVICE

[75] Inventor: Naoki Yokoyama, Atsugi, Japan

[73] Assignee: Fujitsu Limited, Kawasaki, Japan

[21] Appl. No.: 161,272

[22] Filed: Feb. 22, 1988

Related U.S. Application Data

[63] Continuation of Ser. No. 796,406, Nov. 8, 1985, abandoned.

[30] Foreign Application Priority Data

Nov. 19, 1984 [JP] Japan ................. 59-242413

[51] Int. Cl.$^4$ ............................................. H01L 29/80
[52] U.S. Cl. ....................................... 357/22; 357/16; 357/33
[58] Field of Search ............... 357/22 A, 22 D, 22 E, 357/22 F, 22 G, 22 I, 22 V, 22 G-R, 22 S, 34, 33, 16

[56] References Cited

U.S. PATENT DOCUMENTS

| 4,337,473 | 6/1982 | Nishizawa ............... 357/22 E |
| 4,353,081 | 10/1982 | Allyn et al. ............. 357/16 |
| 4,366,493 | 12/1982 | Braslau et al. ........... 357/22 A X |
| 4,378,629 | 4/1983 | Bozler et al. ............ 357/22 E X |
| 4,470,059 | 9/1984 | Nishizawa et al. ........ 357/22 C |
| 4,484,207 | 11/1984 | Nishizawa et al. ........ 357/22 A X |

FOREIGN PATENT DOCUMENTS

| 0077706 | 4/1983 | European Pat. Off. . |
| 2504732 | 4/1981 | France . |
| 60-254778(A) | 12/1985 | Japan . |
| WO81/00489 | 2/1981 | PCT Int'l Appl. . |

OTHER PUBLICATIONS

Bozler, C. D., and Alley, G. D., "Fabrication and Numerical Simulation of the Permeable Base Transistor", IEEE Trans. on Elec. Dev., vol. 27, No. 6, Jun. 1980, pp. 1128–1141.

Kroemer, H., "Heterostructure Bipolar Transistors and Integrated Circuits", Proc. of the IEEE, vol. 70, No. 1, Jan. 1982, pp. 64–76.

Webster's Ninth New Collegiate Dictionary, Merriam-Webster Inc., 1984, p. 401.

Luryi, S., "An Induced Base Hot-Electron Transistor", IEEE Elec. Dev. Lett., vol. EDL-6, No. 4, Apr. 1985, pp. 178–180.

Dumke, W. P., Fang, F. F., & Fowler, A. B., "Heterostructure Long Lifetime Hot Electron Transistor", IBM Tech. Disc. Bull., vol. 24, No. 7A, Dec. 1981, pp. 3229–3231.

U. Mishra, E. Kohn and L. F. Eastman, "Submicron GaAs Vertical Electron Transistor", IEDM Technical Digest 82, pp. 594–597.

Z. Rav-Noy, L-T. Lu, E. Kapon, S. Mukai, S. Margalit, and A. Yariv, "Vertical Field-Effect Transistors in III-V Semiconductors", Applied Physics Letters, vol. 45, No. 3, Aug. 1984, pp. 258–260.

Primary Examiner—Andrew J. James
Assistant Examiner—Sara W. Crane
Attorney, Agent, or Firm—Staas & Halsey

[57] ABSTRACT

A permeable base transistor includes a conductive type emitter layer; a conductive type base layer provided on the emitter layer, the emitter layer having a wider energy bandgap than the base layer; a conductive type collector layer; comb-shaped or lattice-shaped base electrodes formed adjacent to a heterojunction surface formed by the emitter layer and the base layer, the electrodes are provided through a Schottky junction or an insulating layer to the surrounding emitter, base, and collector layers.

10 Claims, 7 Drawing Sheets

SEMICONDUCTOR DEVICE

This is a continuation of co-pending application Ser. No. 796,406 filed on Nov. 8, 1985 now abandoned.

BACKGROUND OF THE INVENTION

1. Field of the Invention

The present invention relates to a semiconductor device, more particularly to a permeable base transistor (PBT).

2. Description of the Related Art

A PBT comprising an emitter layer, comb-shaped or lattice-shaped base electrodes, a base layer, a collector layer, an emitter electrode, and a collector electrode is well known.

In a PBT, the value of the voltage applied to the comb-shaped base electrode can be used to change the coverage of the depletion layer extending from the base electrode in the horizontal direction. This effect can be used to control the electrons which pass between the comb-shaped base electrodes from the emitter layer to the collector layer.

The thickness of the base electrode is about 0.02 μm. This corresponds to a field effect transistor (FET) which has a short channel length of 0.02 μm. Therefore, the base electrons transit time in the PBT is very short, enabling high speed operation.

However, the switching speed of such a PBT is about 15 ps at most. Thus, a higher switching speed PBT is required. To obtain a higher switching speed PBT requires a more complicated structure and special processes.

SUMMARY OF THE INVENTION

An object of the present invention is to eliminate the above-mentioned problems.

Another object of the present invention is to provide a fast switching semiconductor device.

A further object of the present invention is to provide a PBT having a heterojunction.

According to the present invention there is provided a semiconductor device including a conductive type emitter layer; a conductive type base layer provided on the emitter layer, the emitter layer having a wider energy bandgap than the base; a conductive type collector layer; comb-shaped or lattice-shaped base electrodes formed adjacent to a heterojunction surface formed by the emitter layer and the base layer, the electrodes being provided through a Schottky junction or an insulating layer to the surrounding emitter and base layers.

DESCRIPTION OF THE PREFERRED EMBODIMENTS

Before describing the preferred embodiments of the present invention, an explanation of the prior art will be given for reference.

Figure 1:
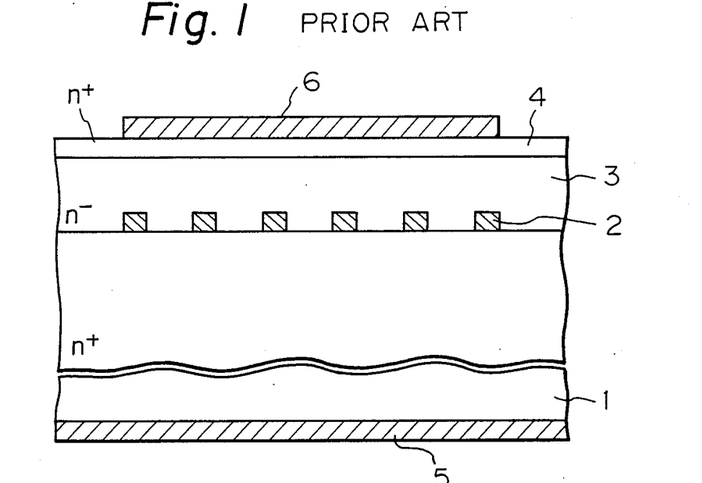
FIG. 1 is a cross-sectional view of a conventional PBT.

FIG. 1 is a cross-sectional view of a conventional PBT.

As shown in FIG. 1, on a n+ type GaAs emitter layer 1, a comb-shaped or lattice-shaped base electrode 2 comprising a high melting point metal such as tungsten (W) or a metal silicide such as tungsten silicide (WSi) is formed. Over the entire surface of the base electrode 2 and the emitter layer 1, an n⁻ type GaAs base layer 3 is formed. On the base layer 3, an n+ type GaAs collector layer 4 is formed. Reference numerals 5 and 6 denote an emitter electrode and collector electrode, respectively.

In the above-mentioned conventional structure of a PBT, as explained above, the transit time of electrons from the emitter layer 1 to the collector layer 4 through the base electrode 2 is limited, so the switching speed limit is about 15 ps.

Figure 2:
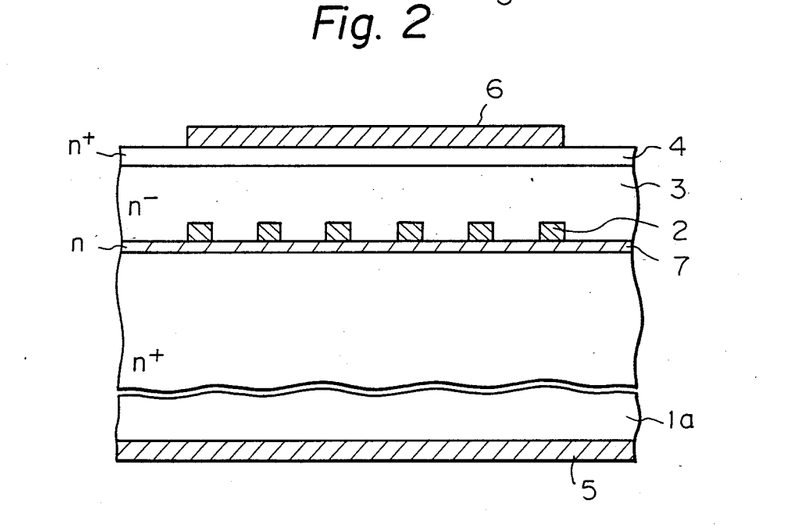
FIG. 2 is a cross-sectional view of an embodiment according to the present invention.

FIG. 2 is a cross-sectional view of an embodiment according to the present invention.

As shown in FIG. 2, an n type AlGaAs emitter layer 7 is additionally formed on the n+ type GaAs emitter layer 1 of FIG. 1. The other elements of the structure, for example, the base electrode 2, are the same as in FIG. 1.

Figure 3:
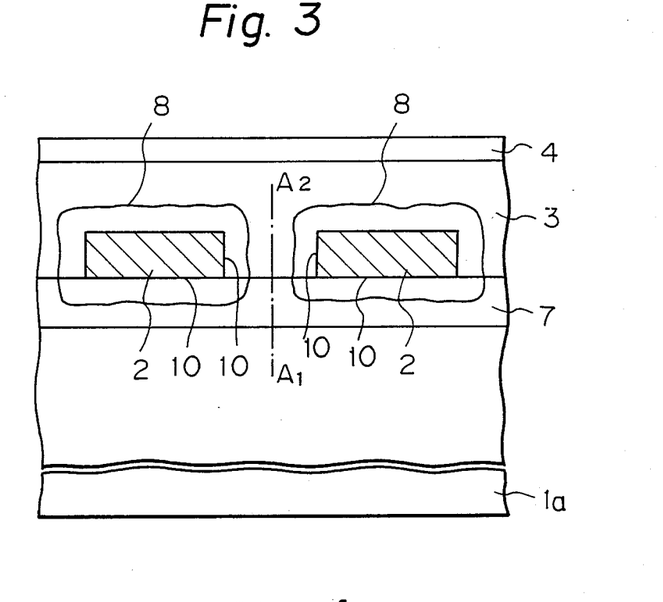
FIGS. 3 and 5 are partial cross-sectional views of the FIG. 2 embodiment illustrating depletion layers with $V_{BE}>0$ and $V_{CE}>0$ and $V_{BE}=0$ and $V_{CE}>0$, respectively.
Figure 5:
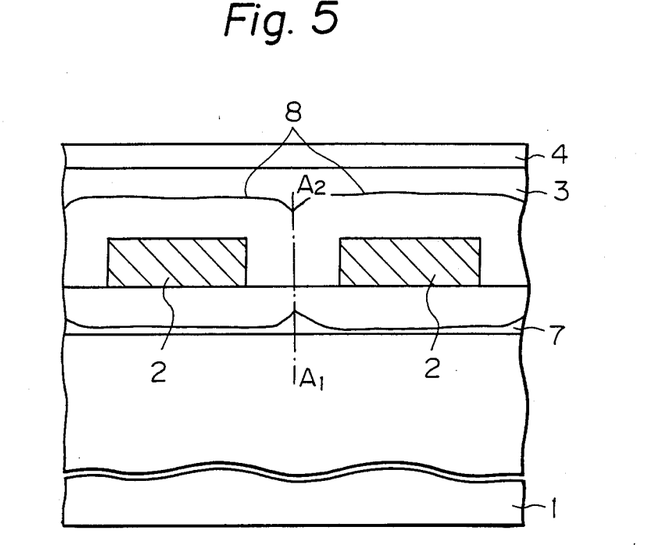

The n type AlGaAs emitter layer 7 has a wider energy bandgap than the n+ type GaAs base layer 3 and n+ type GaAs collector layer 4. Further, the comb-shaped or lattice-shaped base electrodes 2 are formed on a heterojunction surface comprising the n type AlGaAs emitter layer 7 and the n⁻ type GaAs base layer 3. As shown in FIGS. 3 and 5 base electrodes 2 are provided through a Schottky junction or insulation layer 10 to the surrounding emitter and base layers 7, 3. This means the base electrodes 2 should not ohmicly contact the base layer 3 or emitter layer 7.

The operation of the PBT according to the present invention will be explained.

FIGS. 3 and 5 are partial cross-sectional views of the FIG. 2 embodiment, illustrating depletion layers when $V_{BE}>0$ and $V_{CE}>0$, and when $V_{BE}=0$ and $V_{CE}>0$, respectively.

Figure 4:
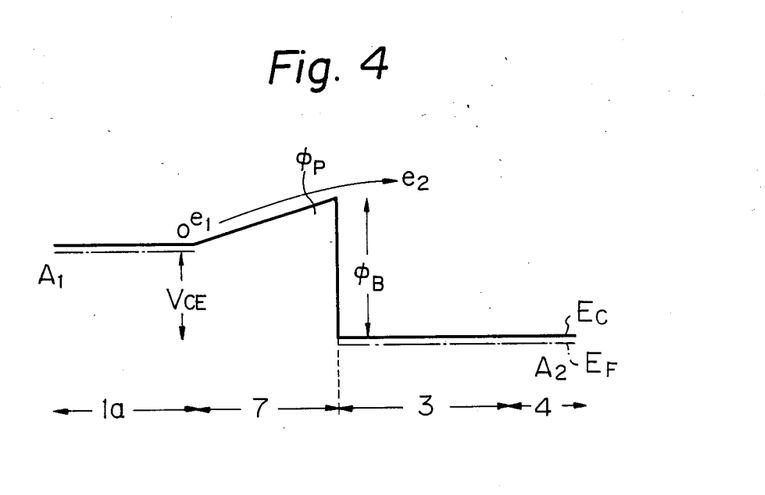
FIGS. 4 and 6 are energy band diagrams for the structures shown in FIGS. 3 and 5, respectively.
Figure 6:
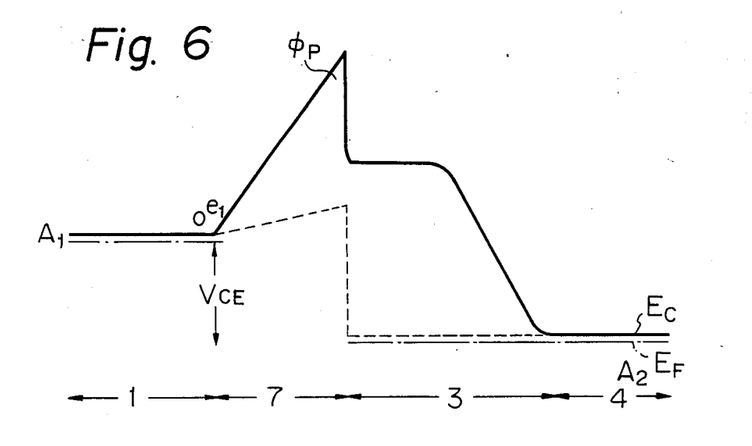

FIGS. 4 and 6 are energy band diagrams for the structures shown in FIGS. 3 and 5, respectively.

In FIGS. 3 to 6, the areas 8 around the comb-shaped or lattice-shaped base electrodes 2 denote depletion layers, and oe₁ and e₂ denote electrons and hot electrons, respectively.

In FIG. 3, when $V_{CE}$ (a voltage between the collector layer 4 and the emitter contact 1a)$>0$, and $V_{BE}$ (a voltage between the base electrodes 2 and the emitter layer)$>0$, the PBT is in an ON state. That is, not all the base layer 3 between the base electrodes 2 and the collector 4 is converted to a depletion layer, so that the potential barrier $\phi_p$ is low as shown in FIG. 4. Consequently, electrons $e_1$ in an emitter contact layer $1a$ are injected into the base layer 3 through the emitter layer 7. Since there is an energy barrier $\phi_B$ due to the wider band gap emitter layer 7, when electrons are injected into the base layer 3, the injected electrons $e_1$ obtain high kinetic energy so that the electrons $e_1$ become hot electrons $e_2$ with a high initial speed. Therefore, such hot electrons $e_2$ can pass through the base layer 3 at a high speed so as to reach the collector layer 4, and generate a collector current. In the case of FIG. 3, the voltage between the base and emitter ($V_{BE}$) is, for example, 0.3 V, and the voltage between the collector and emitter ($V_{CE}$) is, for example, 0.6 V.

On the other hand, when in FIG. 5, $V_{CE}>0$ and $V_{BE}=0$, the PBT is in an ON state. That is, all of the base layer 3 between the base electrodes 2 and the collector 4 is converted to a depletion layer because of the built in potential between the base electrode 2 and the base layer 3, so that the potential barrier $\phi_P$ is high, as shown in FIG. 6. Consequently, the electrons $e_1$ in the emitter contact layer $1a$ are not injected into the base layer 3, and no collector current is generated. In the case of FIG. 5, $V_{CE}$ is given as 0.2 V. In FIG. 6, the broken line illustrates the conduction band in FIG. 4. Therefore, the PBT turns ON or OFF depending upon whether $V_{BE}>0$ or $V_{BE}=0$.

As shown in FIGS. 4 and 6, the barrier height of the emitter layer 7 gradually increases from the emitter contact layer $1a$ to the base layer 3, so as to enable the electrons $e_1$ in emitter contact layer 1 to be injected into the base layer 3 through the wide band gap layer 7.

The electrons $e_1$ injected from the emitter layer 7 into the base layer 3 in FIG. 3, lose potential energy crossing the energy barrier. The electrons $e_1$, however, gain kinetic energy in place of the lost potential energy so that the electrons $e_1$ change to hot electrons $e_2$. Thus, the speed of the electrons $e_2$ in the base layer 3 is increased, for example, to $1 \times 10^8$ cm/sec.

Figure 7:
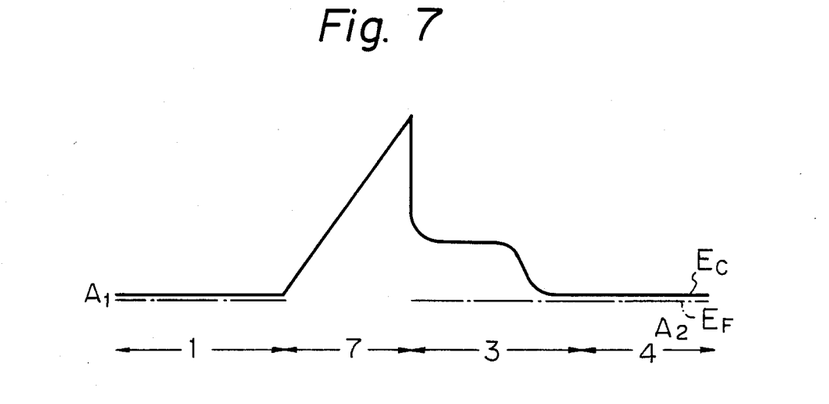
FIG. 7 is an energy band diagram with $V_{BE}=0$ and $V_{CE}=0$, i.e., normally off.

FIG. 7 is an energy band diagram with $V_{CE}=0$ and $V_{BE}=0$, i.e., in the normally off state.

Figure 8:
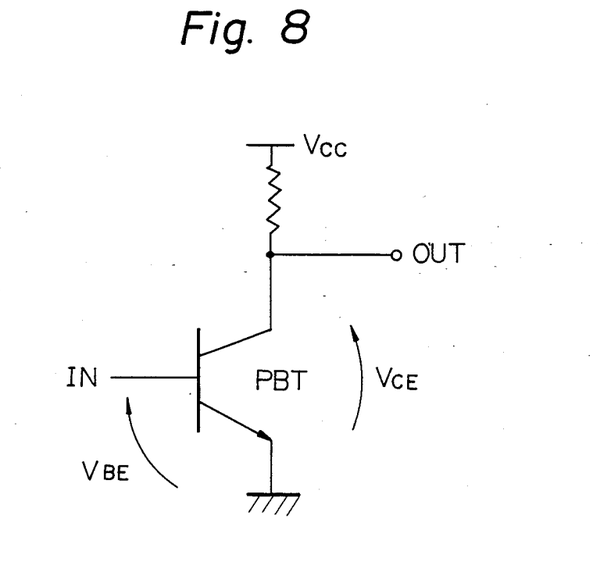
FIG. 8 is a circuit diagram according to the present invention.

FIG. 8 is a schematic diagram of a PBT inventor circuit according to the present invention.

FIGS. 9A to 9D are cross-sectional views illustrating the process of producing a structure according to the present invention.

Figure 9A:
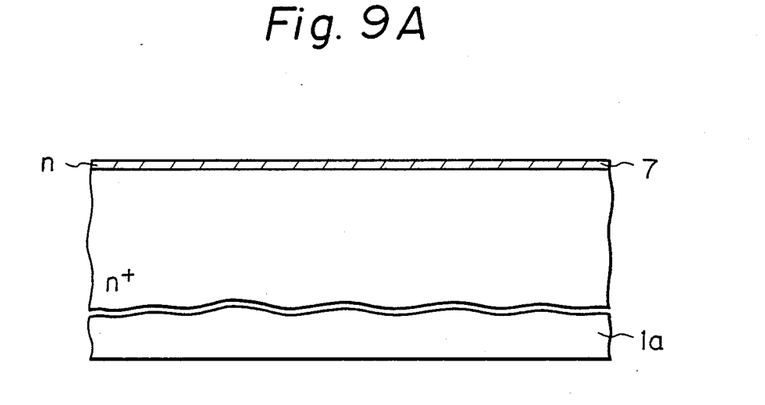
FIGS. 9A to 9D are cross-sectional views illustrating the process of producing a structure according to the present invention.

As shown in FIG. 9A, on an n+ type GaAs emitter contact layer $1a$, an n type $Al_xGa_{1-x}As$ emitter layer 7 having a thickness of about 1000 Å is formed by molecular beam epitaxy (MBE). The X value of the emitter 7 is changed from 0 to 0.3. When the 1000 Å emitter layer 7 is formed, the X value becomes, 0.3, so that the energy barrier $\phi_B$ is formed between the emitter layer 7 and the base layer 3. Furthermore, the graded value of X in the emitter layer generates the graded energy barrier in the emitter layer 7, which in turn gives rise to the graded energy level between the emitter contact layer $1a$ and the base layer 3. The emitter layer 7 can also be formed using a chemical vapor deposition (CVD) process may be used.

Figure 9B:
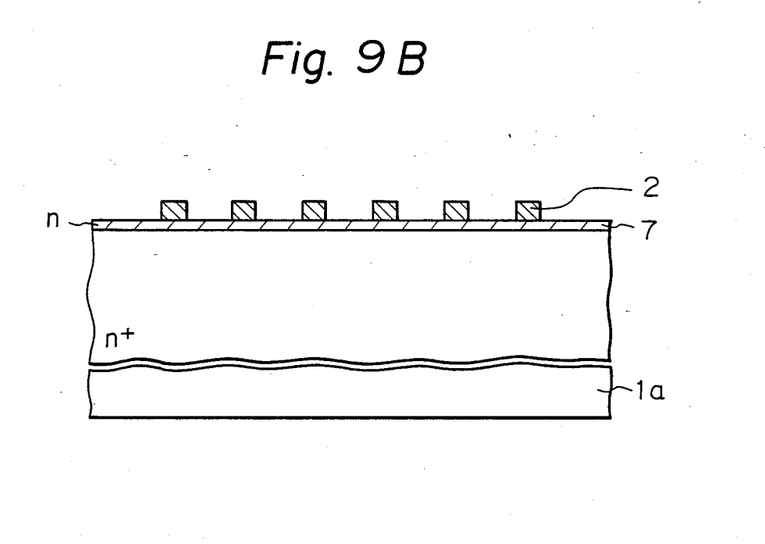

As shown in FIG. 9B, a tungsten layer having a thickness of about 200 Å is formed on the n type $Al_xGa_{1-x}As$ emitter layer 7. The tungsten layer is patterned by a usual photolithography technique to form comb-shaped base electrodes 2.

Figure 9C:
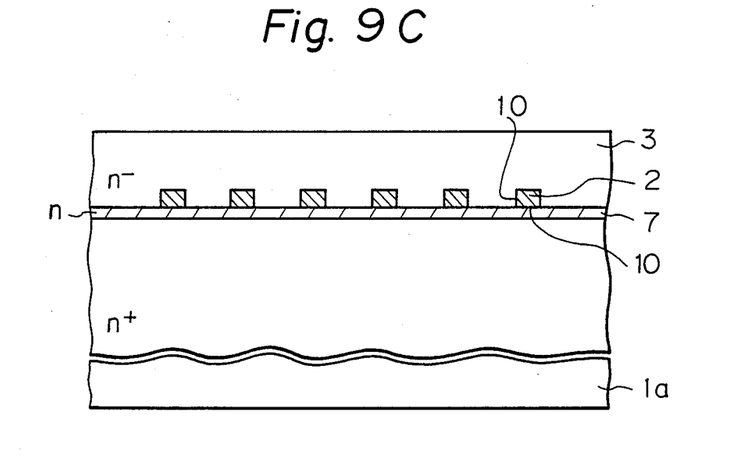

As shown in FIG. 9C, on the obtained structure, an n-type GaAs base layer 3 having a thickness of about 4000 Å with a carrier concentration of $5 \times 10^{16}$ cm$^{-3}$ is formed by the MBE process. In place of the MBE process, a vapor phase epitaxy (VPE) process may be used.

Figure 9D:
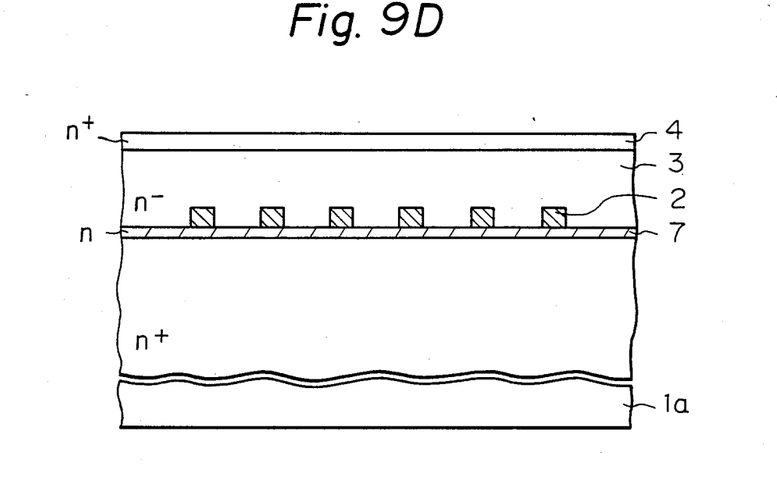

As shown in FIG. 9D, an n+ type GaAs collector layer 4 having a thickness of about 2000 Å is formed on the n− type GaAs base layer 3 by using the MBE or VPE continuously.

Finally, as shown in FIG. 2, an AuGe/Au layer having a thickness of about 4000 Å is formed on the collector layer 4 and the emitter contact layer $1a$ to form a collector electrode 5 and an emitter electrode 6.

It is noted that the base electrodes 2 contact the emitter layer 7 and the base layer 3 via Schottky junction or an insulating layer 10.

In the present invention, in place of the GaAs, $In_yGa_{1-y}As$ may be used. In place of the $Al_xGa_{1-x}As$, InP and $Al_zIn_{1-z}As$ may be used.

Further, according to the present invention the order of the position of the emitter layer, the base layer, and the collector layer may be reversed.

Figure 10:
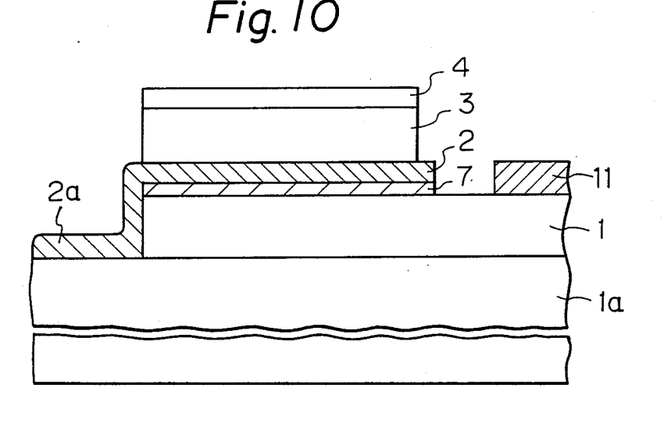
FIG. 10 is a cross-sectional view of an IC device according to the present invention.

In above-mentioned embodiment, a single semiconductor device was explained. However, the single semiconductor device can be easily changed to an IC device. For example, as shown in FIG. 10, on a semiinsulating GaAs substrate $1a$ each semiconductor layer such as a n+ type GaAs emitter layer 1 is formed. After that by a selective mesa etching process, a part of the surface of the n+ type GaAs emitter layer 1 is exposed whereby an emitter electrode 11 may be taken out therefrom.

Figure 11A:
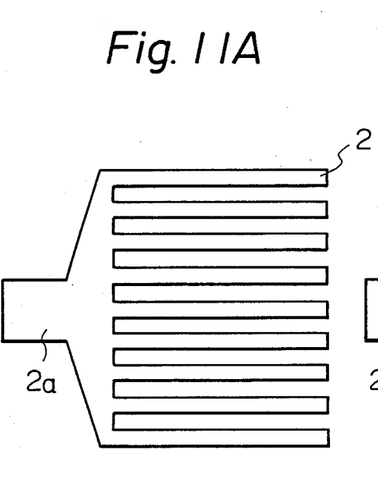
FIG. 11A is a plan view of the comb-shaped base electrode 2 for the FIG. 10 device.

FIG. 11A is a plan view of a comb-shaped base electrode 2.

In FIG. 11A reference numeral $2a$ denotes a contact portion.

Figure 11B:
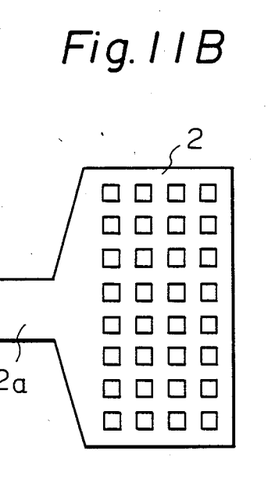
FIG. 11B is a plan view of a lattice-shaped electrode 2 for the FIG. 10 device.

FIG. 11B is a plan view of a lattice-shaped base electrode 2.

I claim:

1. A semiconductor device comprising:
    an emitter layer having a first conductivity type and a first energy band gap and a second energy band gap greater than the first energy band gap;
    a base layer having a predetermined conductivity type, provided on the emitter layer, and having a third energy band gap less than said first band gap of the emitter layer defining a heterojunction surface between the emitter layer and the base layer so that there is a discontinuity between conduction band edges of the emitter layer and the base layer so as to form an energy barrier therebetween so that hot electrons can be injected into said base layer from said emitter layer;
    one of comb-shaped and lattice-shaped base electrodes, formed adjacent to the heterojunction surface; and
    a collector layer having the first conductivity type, provided on the base layer.

2. A semiconductor device according to claim 1, further comprising:
    an emitter contact layer formed on said emitter layer opposite to said base layer,
    wherein the band gap of said emitter layer gradually increases from the emitter contact layer to the base layer.

3. A semiconductor device according to claim 1, wherein the order of the position of the emitter layer, the base layer, and the collector layer is reversed.

4. A semiconductor device according to claim 1, wherein Schottky junctions are formed between said electrodes and said base layer, and between said electrodes and said emitter layer.

5. A semiconductor device according to claim 1, further comprising an insulator layer formed between said electrodes and said base layer and said emitter layer.

6. A semiconductor device according to claim 1, wherein said electrodes are formed so as to not ohmicly contact the base layers and the emitter layer.

7. A semiconductor device comprising:
a first emitter layer having a first conductivity type and comprising a first compound semiconductor;
ax second emitter layer having first and second surfaces, the first surface formed on the first emitter layer and having the first conductivity type, the second emitter layer comprising a second compound semiconductor and having a first energy band gap at the first surface and a second energy band gap at the second surface being larger than the first energy band gap;
a base layer formed on the second surface of said second emitter layer having the first conductivity type, a band gap less than the first band gap so that hot electrons can be injected into said base layer from said second emitter layer and comprising the first compound semiconductor;
electrodes comprising one of comb-shaped and lattice-shaped electrodes, formed in the base layer; and
a collector layer formed on the base layer, having the first conductivity type and comprising the first compound semiconductor.

8. A semiconductor device according to claim 7, wherein the first compound semiconductor comprises GaAs and the second compound semiconductor comprises $Al_xGa_{1-x}As$, where $0 \leq x \leq 1$.

9. A semiconductor device according to claim 7, wherein the first compound semiconductor comprises $In_yGa_{1-y}As$, where $0 \leq y \leq 1$, and the second compound semiconductor consists of one of $In_p$ and $Al_zIn_{1-z}As$, where $0 \leq z \leq 1$.

10. A semiconductor device according to claim 7, wherein a band gap of said second emitter layer gradually increases from the junction between the first emitter layer and the second emitter layer, at which the energy level is approximately equal to an energy level of a conduction band edge of the first emitter layer, to the junction between said second emitter layer and said base layer.

* * * * *